(12) United States Patent
King et al.

(10) Patent No.: US 6,927,382 B2
(45) Date of Patent: Aug. 9, 2005

(54) OPTICAL EXCITATION/DETECTION DEVICE AND METHOD FOR MAKING SAME USING FLUIDIC SELF-ASSEMBLY TECHNIQUES

(75) Inventors: David Andrew King, Menlo Park, CA (US); Richard J. Pittaro, San Carlos, CA (US); Shahida Rana, Fremont, CA (US); Edward Verdonk, San Jose, CA (US); Frederick A. Stawitcke, Sunnyvalle, CA (US); Richard D. Pering, Mountain View, CA (US)

(73) Assignee: Agilent Technologies, Palo Alo, CA (US)

( * ) Notice: Subject to any disclaimer, the term of this patent is extended or adjusted under 35 U.S.C. 154(b) by 28 days.

(21) Appl. No.: 10/153,243

(22) Filed: May 22, 2002

(65) Prior Publication Data

US 2004/0222357 A1 Nov. 11, 2004

(51) Int. Cl.⁷ ............................................. H01L 31/00
(52) U.S. Cl. ..................................... 250/214.1; 257/80
(58) Field of Search .......................... 250/214 R, 214.1, 250/208.1, 208.2, 551; 257/79–103; 438/28, 107

(56) References Cited

U.S. PATENT DOCUMENTS 5,545,291 A    8/1996    Smith et al.

6,599,769 B2 *  7/2003    Kondo et al. ................ 438/28

FOREIGN PATENT DOCUMENTS

WO    WO 00/46854    12/1999
WO    WO 00/55915    1/2000

* cited by examiner

Primary Examiner—Thanh X. Luu

(57) ABSTRACT

The disclosure is directed toward an optical excitation/detection device that includes an arrayed plurality of photodetectors and separately formed photoemitters, as well as a method for making such a device. A CMOS fabricated photodetector array including a plurality of individual photoreceptors is selectively etched back between photoreceptor locations to reveal a plurality of recessed regions having a certain geographic profile. A plurality of semiconductor blocks, each having light emitting capability and each having a certain geometric profile that is complementary in size and shape to the certain geometric profile of the recessed regions, are separately fabricated. These blocks are included within a fluid to form a slurry. The slurry is then flowed over the CMOS fabricated photodetector array in accordance with a fluidic self-assembly technique, and the included semiconductor blocks are individually deposited within each of the plurality of recessed regions in the CMOS fabricated photodetector array. The deposited blocks are then attached within the recessed regions to form the optical excitation/detection device from an arrayed plurality of photodetectors and separately formed photoemitters.

16 Claims, 3 Drawing Sheets

US 6,927,382 B2

OPTICAL EXCITATION/DETECTION DEVICE AND METHOD FOR MAKING SAME USING FLUIDIC SELF-ASSEMBLY TECHNIQUES

BACKGROUND OF THE INVENTION

1. Technical Field of the Invention

The present invention relates to a device for optical excitation/detection including an arrayed plurality of photodetectors and photoemitters and, in particular, to such a device manufactured using fluidic self-assembly techniques.

2. Description of Related Art

Detector arrays (i.e., devices comprising an arrayed plurality of photodetectors) can be fabricated using well known complementary metal oxide semiconductor (CMOS) fabrication techniques. Such arrays are typically of very high quality, exhibit low noise and are inexpensive to produce What is lacking with conventional CMOS fabrication techniques for such devices is a way of easily incorporating a plurality of light emitting devices (for example, light emitting diodes (LEDs), laser diodes, or other type photoemitters) into the CMOS array detector device. For example, standard solid state light emitting devices (like LEDs) are difficult to incorporate onto a CMOS detector array because the process for solid state LED photoemitter fabrication is incompatible with the CMOS fabrication process used to form the photodetectors. The incompatibility generally speaking, precludes the co-development of CMOS photodetectors and solid state LED photoemitters on the same substrate. It is further recognized that solid state photoemitter light sources are generally edge-emitters. The edge-emitter configuration requires that the semiconductor substrate for the LED (that is generally built by layering-up using planar processes to form the photoemitter) be diced and placed on edge when assembled with the CMOS photodetectors What is needed is a device for optical excitation/detection, and a method for making such a device, that includes an arrayed plurality of photodetectors and separately formed photo emitters

SUMMARY OF THE INVENTION

One embodiment of the present invention comprises an optical excitation/detection device utilizing a CMOS fabricated photodetector array. The CMOS array includes a plurality of individual photoreceptors and a plurality of recessed regions having a certain geometric profile formed between the photoreceptors. A plurality of separate semiconductor blocks, each having light emitting capability and each having a certain geometric profile that is complementary in size and shape to the certain geometric profile of the recessed regions, are deposited within the plurality of recessed regions in the CMOS fabricated photodetector array to form an optical excitation/detection device that includes an arrayed plurality of photodetectors and separately formed photoemitters.

A method for assembling an optical excitation/detection device in accordance with an embodiment of the present invention etches back a top surface of a CMOS fabricated photodetector array including a plurality of individual photoreceptors to form a plurality of recessed regions having a certain geometric profile. Separately fabricated semiconductor blocks having light emitting capability and a certain geometric profile that is complementary in size and shape to the certain geometric profile of the recessed regions are then deposited within the plurality of recessed regions in the CMOS fabricated photodetector array.

In a preferred embodiment of the device and method, the operation for depositing the separate semiconductor blocks is accomplished using fluidic self-assembly techniques.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE EXEMPLARY EMBODIMENTS OF THE INVENTION

Figure 1:
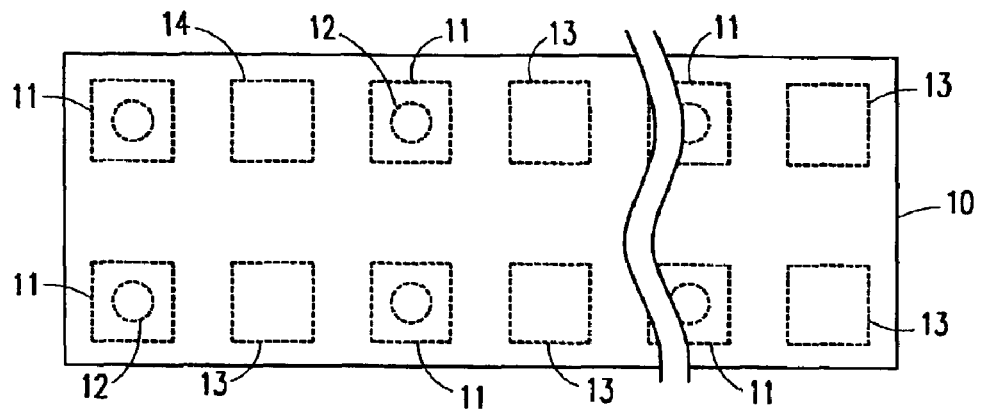
FIG. 1 is a top view of a CMOS fabricated photodetector array.
Figure 2A:
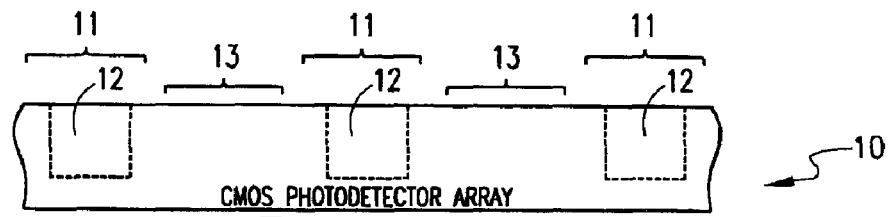
FIGS. 2A–2K are diagrams illustrating a sequence of steps performed in connection with the fabrication of an optical excitation/detection device in accordance with an embodiment of the present invention
Figure 2B:
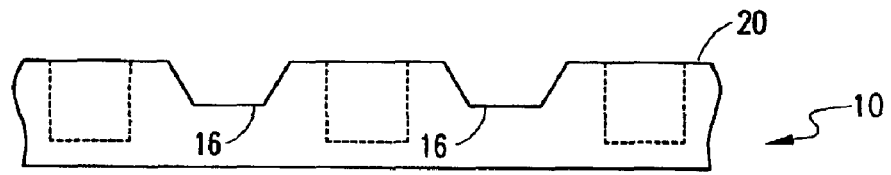

Reference is now made to FIG. 1 wherein there is shown a top view of a complementary metal oxide semiconductor (CMOS) photodetector array 10. It will be recognized by those skilled in the art that the features illustrated in FIG. 1 are not necessarily drawn to scale and that the size of certain features, dimensions, and the like, may be exaggerated to ease illustration and understanding. The CMOS array 10 is fabricated using conventional complementary metal oxide semiconductor fabrication techniques and includes an arrayed plurality of photoreceptor areas 11 and an arrayed plurality of photoemitter areas 13. Within each photoreceptor area 11, the CMOS fabrication process is used to form an integrated photoreceptor 12 (also referred to as a photodiode). Examples of such photoreceptors 12 include p-i-n diodes, avalanche photodiodes, charge coupled devices, or the like Associated circuitry (not specifically illustrated) for the photoreceptors 12 (for example, biasing circuits, filters, amplifiers, quadrature detectors, A/D converters, clocks, memory, and the like) is also fabricated using the CMOS techniques on a common substrate with the photoreceptors 12 The photoemitter areas 13 comprise reserved areas on the CMOS array 10 for subsequent addition of a photoemitter capability to the CMOS array 10 in a manner to be described below. Associated circuitry (not specifically illustrated) for the photoemitter capability (for example, current sources, modulation generators, temperature compensators, amplifiers, drivers, and the like) is also fabricated using the CMOS techniques on a common substrate with the photoreceptors 12 (and their associated circuitry) Specific detailed description of the CMOS fabrication process used to create the CMOS array 10 (including the arrayed photoreceptors 12, and associated circuitry for the photoreceptor areas 11 and photoemitter areas 13) is not provided as these process steps are considered to be well within the capabilities and understanding of one skilled in the art Reference is now made to FIGS. 2A–2K wherein there are shown diagrams illustrating a sequence of steps performed in connection with the fabrication of an optical excitation/detection device in accordance with an embodiment of the present invention. It will be recognized by those skilled in the art that the features illustrated in FIGS. 2A–2K are not necessarily drawn to scale and that the size of certain features, dimensions, and the like, may be exaggerated to ease illustration and understanding. In FIG. 2A, conventional complementary metal oxide semiconductor (CMOS) fabrication techniques are used to form a photodetector array 10 shown in FIG. 1. Next, as shown in FIG. 2B, the semiconductor structure comprising the CMOS array 10 is etched back from a top surface 14 thereof at the locations of the photoemitter areas 13 to provide an arrayed plurality of recessed regions (also referred to as trenches, receptors or binding sites) 16 between the photoreceptors 12 and the photoreceptor areas 11. The etch back may reveal electrical contacts (for example, a ground or drive signal contact layer that has been buried by the CMOS fabrication process for the CMOS array 10) that are designed into the structure of the CMOS array 10. The electrical contacts are to be made available at the locations of the recessed regions 16. A variety of techniques for etching including, wet etching, plasma etching, reactive ion etching, ion milling, and the like, may be used singly or in combination to form the recessed regions 16 in the top surface 14. Regardless of the etching technique used, the end result is the formation of the recessed regions 16 between photoreceptors 12 to have a certain geometric profile As an example, that certain geometric profile may comprise a trapezoidal profile or an inverted truncated pyramid shape. It will, of course, be understood that the future locations of the recessed regions 16 between the photoreceptors 12 must be taken into account in designing and fabricating the CMOS photodetector array 10 (as shown in FIG. 2A), especially with respect to the placement of the individual photoreceptors 12 and any supporting circuitry or interconnections.

Figure 2C:
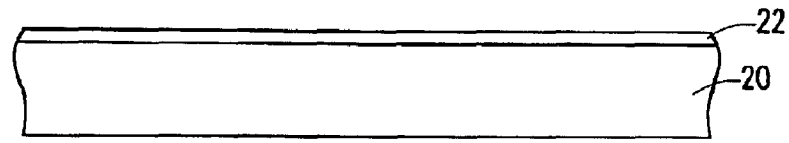
Figure 2D:
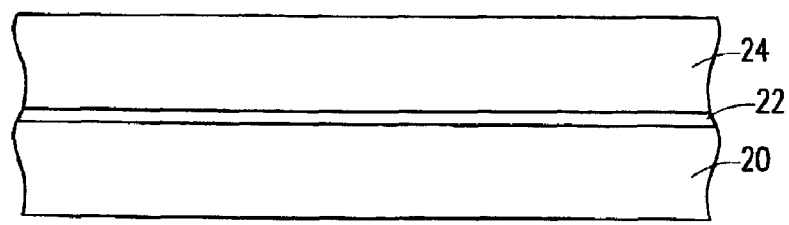
Figure 2E:
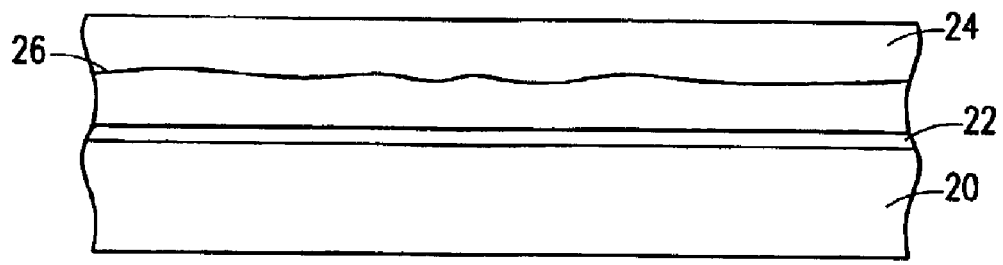

Turning now to FIG. 2C, a gallium arsenide layer 20 is provided (perhaps from a wafer) and a sacrificial layer 22 is formed thereon by chemical vapor deposition, sputtering or the like The sacrificial layer 22 may include aluminum arsenide, indium phosphate, silicon dioxide, photoresist, or the like material that is capable of being selectively etched Next, in FIG. 2D, a gallium arsenide layer 24 is then formed over the sacrificial layer 22 using, for example, molecular beam epitaxy, chemical vapor deposition, and the like. Using appropriate semiconductor ion diffusion techniques known to those skilled in the art, a p-n junction 26 is formed in the gallium arsenide layer 24 (see, FIG. 2E)

Figure 2F:
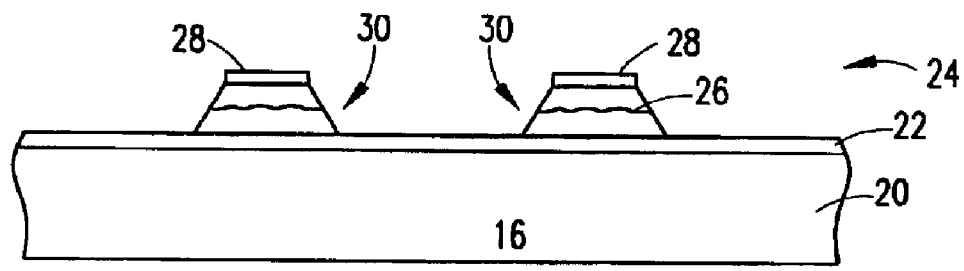
Figure 2G:
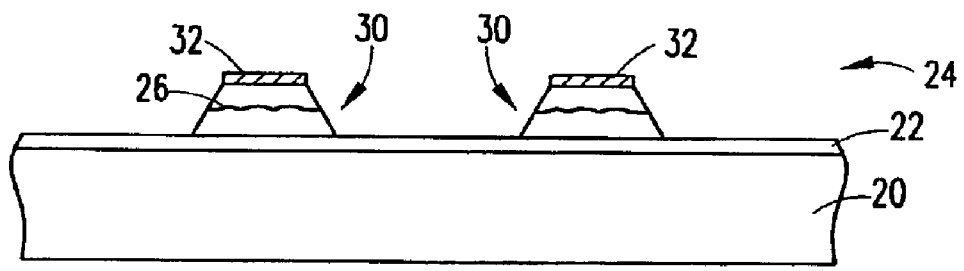
Figure 2H:
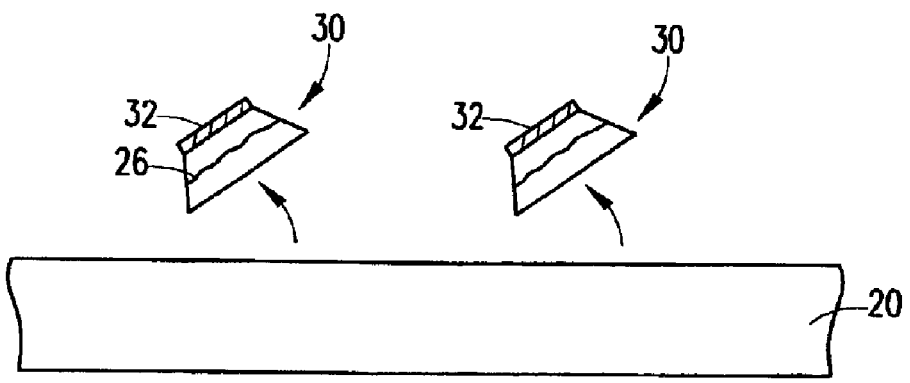
Figure 2I:
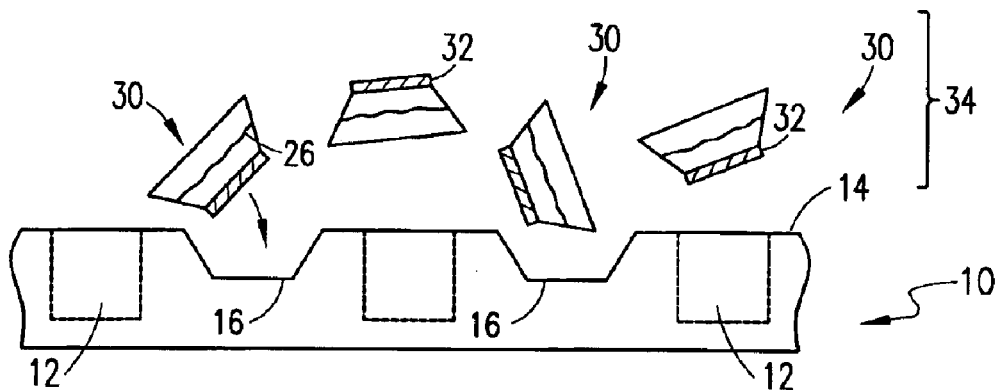
Figure 2J:
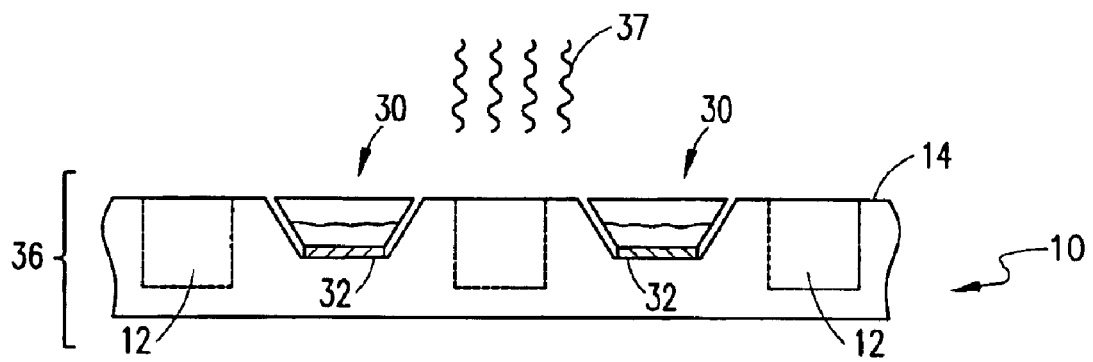
Figure 2K:
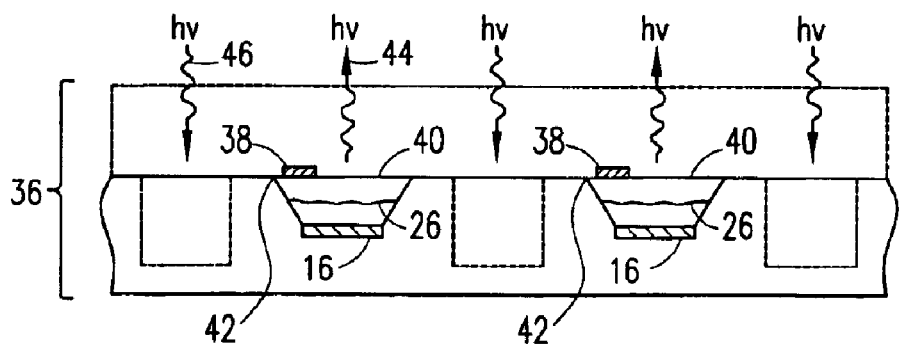

With the use of appropriate masking and etching actions (and with the assistance of patterned photoresist layer 28), individual gallium arsenide mesas or blocks 30, as shown in FIG. 2F, are formed from the gallium arsenide layer 24. These blocks 30 have a certain geometric profile that may comprise a trapezoidal profile or a truncated pyramid shape that is, generally speaking, complementary in size and shape to the recessed regions 16 provided in the CMOS photodetector array 10 (see, FIG. 2B). Following mesa/block 30 formation, a metalization layer 32 is formed in FIG. 2G on a top of each mesa through conventional masking, etching and sputtering techniques. The blocks 30 are then removed from the gallium arsenide layer 20, as shown in FIG. 2H, using a lift-off technique that preferentially etches the sacrificial layer 22 with an etchant (like hydrofluoric acid) that does not attack the gallium arsenide layer 24 used to form the blocks 30. Other methods for lift-off known to those skilled in the art may alternatively be used. Well known methods for diluting and decanting may be used to remove the blocks 30 from the etchant. Still further, a rinsing operation may be used on the removed blocks 30, where the rinsing solution provides a medium (or fluid) for creating a mixture (also referred to herein as a slurry) having the removed blocks suspended therein Reference is now made to FIG. 2I wherein the slurry 34 containing the removed blocks 30 is evenly spread, poured or flowed as a wash over the top surface 14 of the CMOS array 10 (see, also, FIG. 2B). When deposited in this manner, the blocks 30 flow evenly with the fluid, tumble onto the top surface 14, self-align, and settle into the recessed regions 16 as shown in FIG. 2J. Following this operation for fluidic self-assembly, excess slurry is removed and the resulting structure 36 is heated 37 to mechanically bond the metallization layer 32 of each block 30 to a bottom surface of the recessed region 16 (this action also electrically, if needed, bonds the layer 32 to an underlying contact or layer that has been revealed in the recessed regions 16). The heating 37 can be accomplished by any of many known techniques for applying heat. Next, as shown in FIG. 2K, metallized contacts 38 are formed on the surface 40 of each deposited and attached block 30 through conventional masking etching and sputtering techniques, and appropriate conductive interconnects (schematically and generally illustrated with reference layer 42) are formed between the CMOS circuitry of the CMOS array 10 and the separately deposited blocks 30 whose p-n junctions 26 each form an individual light emitting diode (LED), laser, or the like photoemitter, for the structure 36. It is from this p-n junction that an emitted beam of light 44 is selectively produced when an electric potential is applied to the metallizations 32 and 38. In this structure 36, the individual photoreceptors 12 operate to receive an incident beam of light 46 and generate a data signal (in either an analog or digital format) having a magnitude that is proportionate to measured light intensity. The structure 36 accordingly provides an optical excitation/detection device including an arrayed plurality of photodetectors and separately formed photoemitters.

A more detailed explanation of one process for fluidic self-assembly of blocks into recessed regions of a silicon substrate may be obtained from a review of U.S. Pat. No. 5,545,291, the disclosure of which is hereby incorporated by reference. This disclosed process may be utilized in connection with the assembly process of the present invention where blocks 30 are self-assembled into recessed regions formed in a CMOS fabricated photodetector array 10

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

We claim:

1. An optical excitation/detection device, comprising:
  a CMOS fabricated photodetector array including a plurality of individual CMOS integrated photoreceptors, said CMOS integrated photoreceptors are not a deposited circuit block on said CMOS fabricated photodetector array, the array having a top surface into which is formed, between the CMOS integrated photoreceptors, a plurality of recessed regions having a certain geometric profile, each of the recessed regions being for receiving a photoemitter semiconductor block; and
  a plurality of separate photoemitter semiconductor blocks each said photoemitter semiconductor block comprising a photoemitter and each having a certain geometric profile that is complementary in size and shape to the certain geometric profile of the recessed regions, the separate photoemitter semiconductor blocks being deposited to fit within the plurality of recessed regions in the CMOS fabricated photodetector array, wherein only the photoemitter semiconductor blocks are deposited in the recessed regions.

2. The device as in claim 1 wherein the separate photoemitter semiconductor blocks are deposited within the plurality of recessed regions using fluidic self-assembly techniques.

3. The device as in claim 1 further including an interconnect layer overlying the CMOS fabricated photodetector array and the deposited plurality of separate photoemitter semiconductor blocks.

4. The device as in claim 1 wherein the CMOS integrated photoreceptors formed in the CMOS fabricated array comprise p-i-n diodes.

5. The device of claim 1, wherein the CMOS integrated photoreceptors formed in the CMOS fabricated array comprise avalanche photodiodes (APDs).

6. The device as in claim 1 wherein a photoemitter capability for each of the separate photoemitter semiconductor blocks is provided by a p-n junction.

7. The device as in claim 6, wherein the p-n junction is formed in a layer of gallium arsenide.

8. The device as in claim 6, wherein the p-n junction is formed in a layer of indium gallium nitride.

9. The device of claim 6, further comprising a dielectric layer on at least one side of the p-n junction, said dielectric layer being used as part of a laser diode.

10. The device as in claim 1 wherein each of the separate photoemitter semiconductor blocks comprises a light emitting diode (LED).

11. A method for assembling an optical excitation/detection device from a CMOS fabricated photodetector array including a plurality of individual CMOS integrated photoreceptor, wherein said CMOS integrated photoreceptors are not deposited as circuit blocks on said optical excitation/detection device comprising steps of:

etching back a top surface of the CMOS fabricated photodetector array to form, between the CMOS integrated photoreceptors, a plurality of recessed regions having a certain geometric profile, each of the recessed regions being for receiving a photoemitter semiconductor block;

fabricating a plurality of separate photoemitter semiconductor blocks each said separate photoemitter semiconductor block comprising a photoemitter, a metalization layer on a bottom surface thereof, and each having a certain geometric profile that is complementary in size and shape to the certain geometric profile of the recessed regions;

depositing the separate photoemitter semiconductor blocks to fit within the plurality of recessed regions in the CMOS fabricated photodetector array, wherein only one of the photoemitter semiconductor blocks are deposited in each of the recessed regions; and heating said optical excitation/detection device to mechanically bond each said metalization layer within each of the plurality of recessed regions.

12. The method as in claim 11 wherein the step of depositing comprises the step of performing fluidic self-assembly to deposit the separate photoemitter semiconductor blocks.

13. The method as in claim 12 wherein the step of performing comprises the steps of:

including the plurality of separate semiconductor blocks in a fluid to form a slurry; and flowing the slurry over the top surface of the CMOS fabricated photodetector array to deposit the included separate photoemitter semiconductor blocks in the recessed regions.

14. The method as in claim 11 further including the step of attaching the deposited separate photoemitter semiconductor blocks within the recessed regions of the CMOS fabricated semiconductor array.

15. The method as in claim 11 further including the step of forming an interconnect layer over the CMOS fabricated semiconductor array and deposited separate photoemitter semiconductor blocks.

16. An optical excitation/detection device, comprising:

a fabricated photodetector array including a plurality of individual, non-deposited, integrated photoreceptors, wherein the integrated photoreceptors are charged coupled devices, the array having a top surface into which is formed, between the integrated photoreceptors, a plurality of recessed regions having a certain geometric profile, the recessed regions being for receiving a photoemitter semiconductor block; and a plurality of separate photoemitter semiconductor blocks, each one of the separate photoemitter semiconductor blocks comprising a photoemitter and each one having a certain geometric profile that is complementary in size and shape to the certain geometric profile of the recessed regions, the separate photoemitter semiconductor blocks being deposited to fit within the plurality of recessed regions in the fabricated photodetector array, where only the separate photoemitter semiconductor blocks are deposited in the recessed regions.

* * * * *